US007726851B2

(12) United States Patent
Shuai et al.

(10) Patent No.: US 7,726,851 B2
(45) Date of Patent: Jun. 1, 2010

(54) LED LAMP WITH A HEAT DISSIPATION DEVICE

(75) Inventors: Chun-Jiang Shuai, Shenzhen (CN); Guang Yu, Shenzhen (CN); Cheng-Tien Lai, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 134 days.

(21) Appl. No.: 12/017,311

(22) Filed: Jan. 21, 2008

(65) Prior Publication Data

US 2009/0129075 A1 May 21, 2009

(30) Foreign Application Priority Data

Nov. 16, 2007 (CN) ........................ 2007 1 0124553

(51) Int. Cl.
*F21V 29/00* (2006.01)
*H01L 23/34* (2006.01)

(52) U.S. Cl. .................. 362/373; 362/249.02; 362/294; 362/218

(58) Field of Classification Search ................. 362/218, 362/249.02, 294, 373
See application file for complete search history.

(56) References Cited

U.S. PATENT DOCUMENTS

| | | | | |
|---|---|---|---|---|
| 4,012,770 | A * | 3/1977 | Pravda et al. | 257/715 |
| 7,329,030 | B1 * | 2/2008 | Wang | 362/373 |
| 2008/0130299 | A1 * | 6/2008 | Dorogi | 362/373 |
| 2008/0158888 | A1 * | 7/2008 | Chen | 362/294 |
| 2009/0095959 | A1 * | 4/2009 | Lai et al. | 257/79 |
| 2009/0129103 | A1 * | 5/2009 | Zhang et al. | 362/373 |

FOREIGN PATENT DOCUMENTS

CN 101029723 A 9/2007

* cited by examiner

*Primary Examiner*—Stephen F Husar
*Assistant Examiner*—James W Cranson
(74) *Attorney, Agent, or Firm*—Jeffrey T. Knapp

(57) ABSTRACT

An LED lamp includes a heat sink, a plurality of vapor chambers mounted on the heat sink and an LED module mounted on the vapor chambers. The heat sink includes a base, a plurality of fins extending from a first surface of the base and a triangular ridge formed on a second surface opposite to the first surface of the base. The vapor chambers are mounted on the ridge of the base. The LEDs over two slopes of the ridge are oriented slantwise outwardly, thereby increasing an irradiation angle and area of the LED lamp.

18 Claims, 5 Drawing Sheets

LED LAMP WITH A HEAT DISSIPATION DEVICE

BACKGROUND OF THE INVENTION

1. Field of the Invention

The present invention relates to a light emitting diode (LED) lamp, and more particularly to an LED lamp incorporating vapor chambers for improving heat dissipation of the LED lamp.

2. Description of Related Art

An LED lamp is a type of solid-state lighting that utilizes light-emitting diodes (LEDs) as a source of illumination. An LED is a device for transferring electricity to light by using a theory that, if a current is made to flow in a forward direction through a junction comprising two different semiconductors, electrons and cavities are coupled at the junction region to generate a light beam. The LED has an advantage that it is resistant to shock, and has an almost eternal lifetime under a specific condition; thus, the LED lamp is intended to be a cost-effective yet high quality replacement for incandescent and fluorescent lamps.

LED modules for use in an LED lamp require many LEDs, and most of the LEDs are driven at the same time, which results in a quick rise in temperature of the LED modules. Therefore, a heat dissipation device is needed to dissipate heat generated by the LED modules of the LED lamp. A related heat dissipation device attached to the LED modules usually comprises a heat sink having a base and a plurality of fins mounted on the base. The fins are located parallel to each other and each fin is perpendicular to the base. A plurality of channels are defined between the fins of the heat sink and arranged parallel to each other. A cooling airflow passes through the channels defined by the fins of the heat sink, whereby heat of the fins from the base by absorbing the heat generated by the LED modules can be dissipated to atmosphere. Accordingly, the LED lamp can be cooled to some degree.

However, as a power of the LED modules for use in the LED lamp continues to increase, an amount of heat generated by the LED modules becomes more and more huge. Operation of the conventional LED modules has a problem of instability because of insufficient heat dissipating efficiency of the heat dissipation device. Consequently, the light from the LED lamp often flickers, which degrades the quality of the illumination.

Besides, since the LED modules are generally arranged on a flat surface of a heat dissipation device, an illumination angle and area of the LED lamp is limited.

What is needed, therefore, is an LED lamp with a heat dissipation device, which has a great heat dissipating capability. Furthermore, the heat dissipation device has a unique design, whereby the LED lamp can have a larger illumination angle and area.

SUMMARY OF THE INVENTION

An LED lamp includes a heat sink, a plurality of vapor chambers mounted on the heat sink and an LED module mounted on the vapor chambers. The LED module includes a plurality of printed circuit boards with a plurality of LEDs arrayed thereon. The heat sink includes a base, a plurality of fins extending from a first surface of the base and a triangular ridge formed on a second surface opposite to the first surface of the base. The vapor chambers are mounted on the ridge of the base. The LEDs over two lateral sides of the ridge are oriented slantwise outwardly thereby increasing an illuminating angle and area of the LED lamp.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
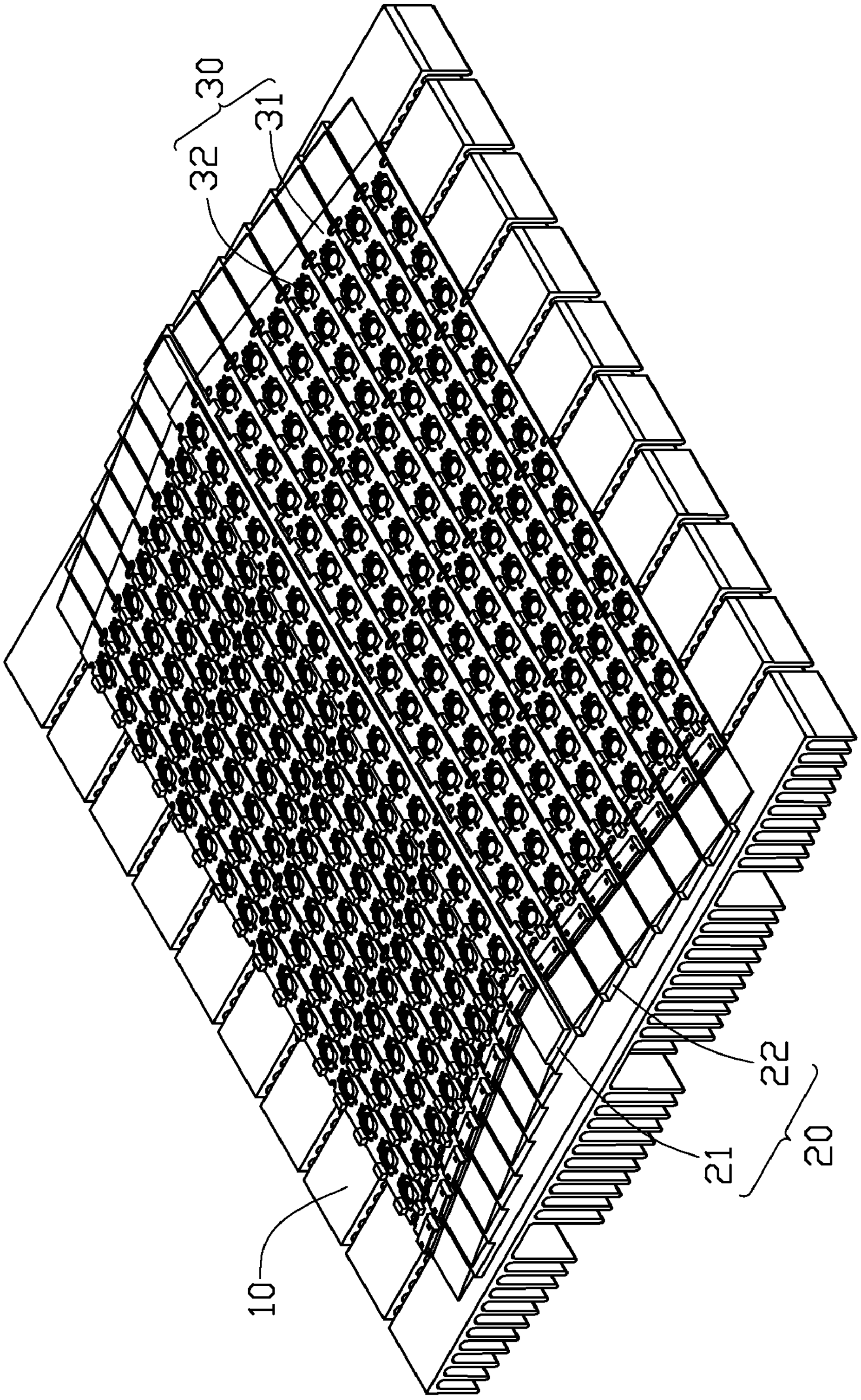
FIG. 1 is an isometric, assembled view of an LED lamp with a heat dissipation device in accordance with a preferred embodiment of the present invention.
Figure 2:
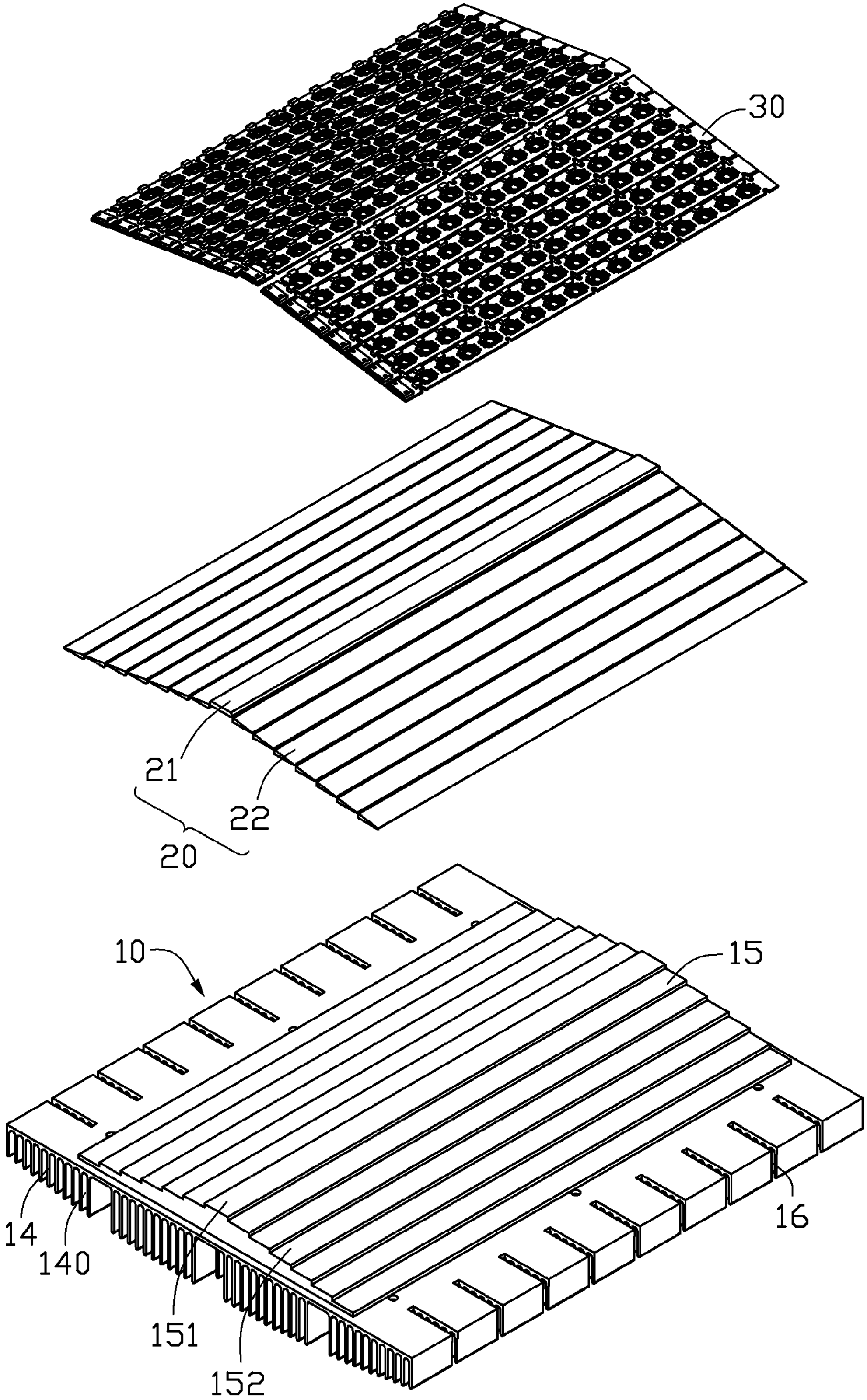
FIG. 2 is an exploded view of FIG. 1.
Figure 3:
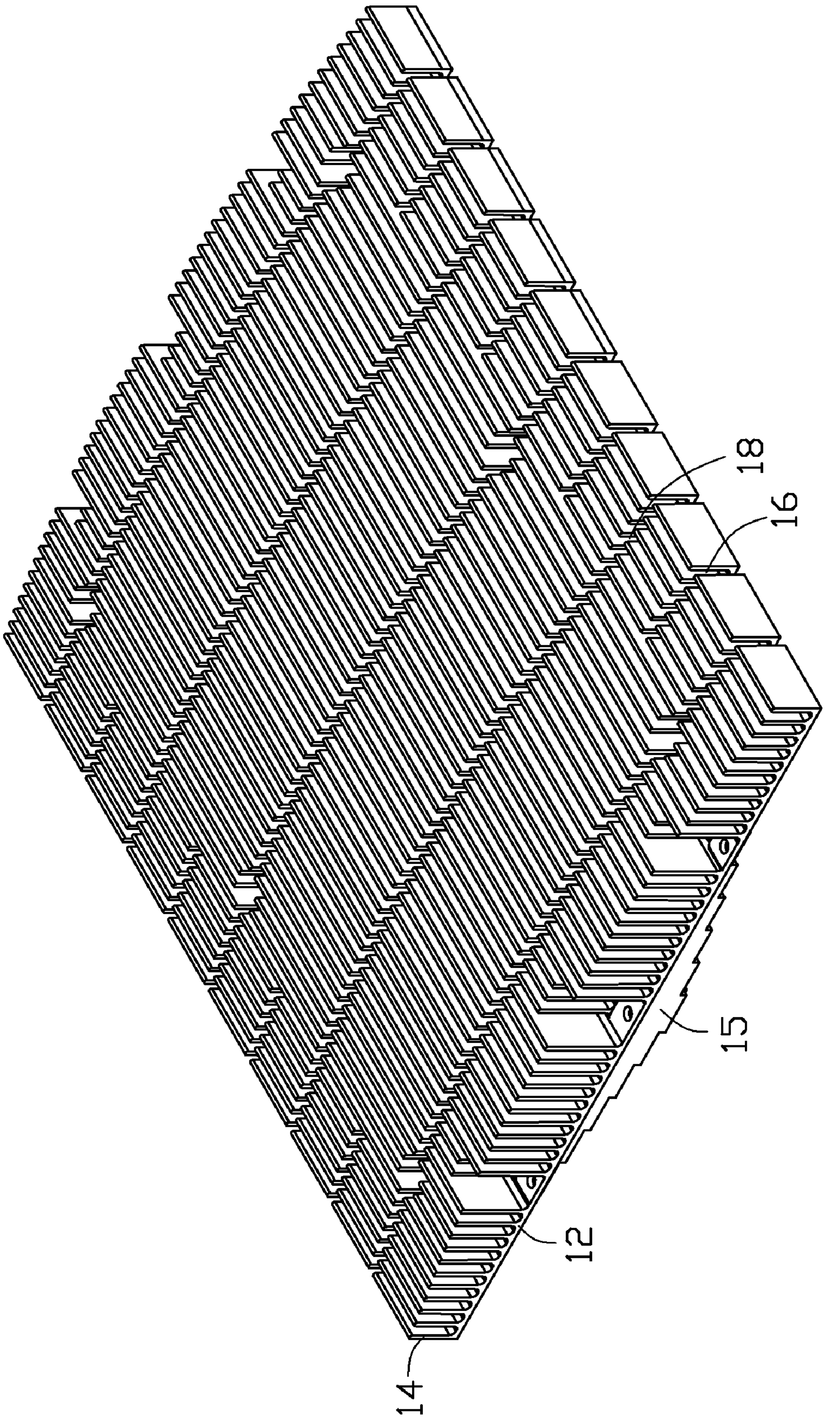
FIG. 3 is an assembled view of FIG. 1, viewed from another aspect.

Referring to FIGS. 1-3, an LED lamp with a heat dissipation device in accordance with a preferred embodiment is illustrated. The LED lamp comprises a heat sink 10, a plurality of vapor chambers 20 mounted on the heat sink 10 and an LED module 30 attached to the vapor chambers 20. The heat sink 10 and vapor chambers 20 are used to cool down the LED module 30 to keep the LED module 30 working within an acceptable temperature range.

The heat sink 10 comprises a base 12, a plurality of fins 14 extending from a bottom surface of the base 12 and a triangular ridge 15 formed on a top surface of the base 12. The base 12 has a substantially rectangular shape. The fins 14 extend downwardly from the bottom surface of the base 12 and perpendicular to the base 12. The fins 14 extend along a longitudinal direction and parallel to each other. A plurality of longitudinal channels 140 are defined between every two adjacent fins 14 and parallel to long sides of the base 12. Heights of the fins 14 are gradually decreased along a direction away from a middle portion of the base 12 in such a manner that a top of the fins 14 has an arced configuration (clearly seen from FIG. 4). A plurality of transverse slits 16 are defined through two opposite long side edges of the base 12 and fins 14 at the side edges of the base 12 to interrupt continuity of a part of the two side edges of the base 12 and the fins 14 located at the side edges of the base 12. The slits 16 are arranged at intervals and along a direction parallel to two short sides of the base 12 of the heat sink 10, i.e., perpendicular to the channels 140. The fins 14 located at the two side edges of the base 12 are accordingly divided by the slits 16 into a plurality of small parts separated with each other to define a plurality of airflow passages. A plurality of grooves 18 transversely cuts through the fins 14 of the heat sink 10 and spaced with each other at predetermined intervals each equal to a double of the interval between two neighboring slits 16. Each groove 18 is arranged to directly communicate with a corresponding slit 16 so that the grooves 18 and the corresponding slits 16 extend continuously through the fins 14 along a direction perpendicular to the channels 140 between the fins 14 of the heat sink 10, whereby the channels 140 are divided into a plurality of parts via the slits 16 and the grooves 18.

The ridge 15 is integrally formed on the top surface of the base 12. The ridge 15 extends along a direction parallel to the long sides of the base 12 and extends almost over an entire length of the base 12. A top end 151 of the ridge 15 is parallel to the fins 14 and positioned at a middle portion of the top surface of the base 12. A height of the ridge 15 is decreased along a direction from the top end 151 toward two lateral sides of the ridge 15. A plurality of steps 152 is formed on each of the two lateral sides of the ridge 15. The steps 152 are symmetric in respect to the top end 151 of the ridge 15. The slits 16 are located beside two lateral sides of the ridge 15.

The vapor chambers 20 comprises a first vapor chamber 21 and a plurality of second vapor chambers 22. The first vapor chamber 21 is a rectangular, bar-shaped and mounted on the top end 151 of the ridge 15. Each of the second vapor chambers 22 is triangular, prism-shaped. The second vapor chambers 22 are fitly attached on the steps 152 of the ridge 15, respectively. Each second vapor chamber 22 has an inclined surface (not labeled) over each of the steps 152 at the two lateral sides of the ridge 15 (clearly seen from FIG. 4). The inclined surfaces of the second vapor chambers 22 located at a lateral side of the first vapor chamber 21 together form a large inclined surface over the ridge 15.

The LED module 30 comprises a plurality of printed circuit boards 31 and a plurality of LEDs 32 arrayed on the printed circuit boards 31. The printed circuit boards 31 each have a bar-shaped configuration and are mounted side by side on the inclined surfaces formed by the second vapor chambers 22 and on the first vapor chamber 21. Understandably, the printed circuit boards 31 on the second vapor chambers 22 can be replaced by two larger, single printed circuit boards, whereby the LEDs 32 can be bonded thereon in matrix.

In assembly, the first vapor chamber 21 is mounted on the top end 151 of the ridge 15, and the second vapor chambers 22 are fitly mounted on the steps 152 of the ridge 15. The printed circuit boards 31 of the LED module 30 thermally contact the vapor chambers 20, respectively. The printed circuit boards 31 are mounted on the inclined surfaces of the second vapor chambers 22 on the two lateral sides of the ridge 15, whereby an acute angle is defined between the printed circuit boards 31 on the second vapor chambers 22 and the top surface of the base 12. Thus, the light illuminated by the LEDs 32 of the LED lamp in accordance with the present invention has a larger illumination angle and illumination area.

Figure 4:
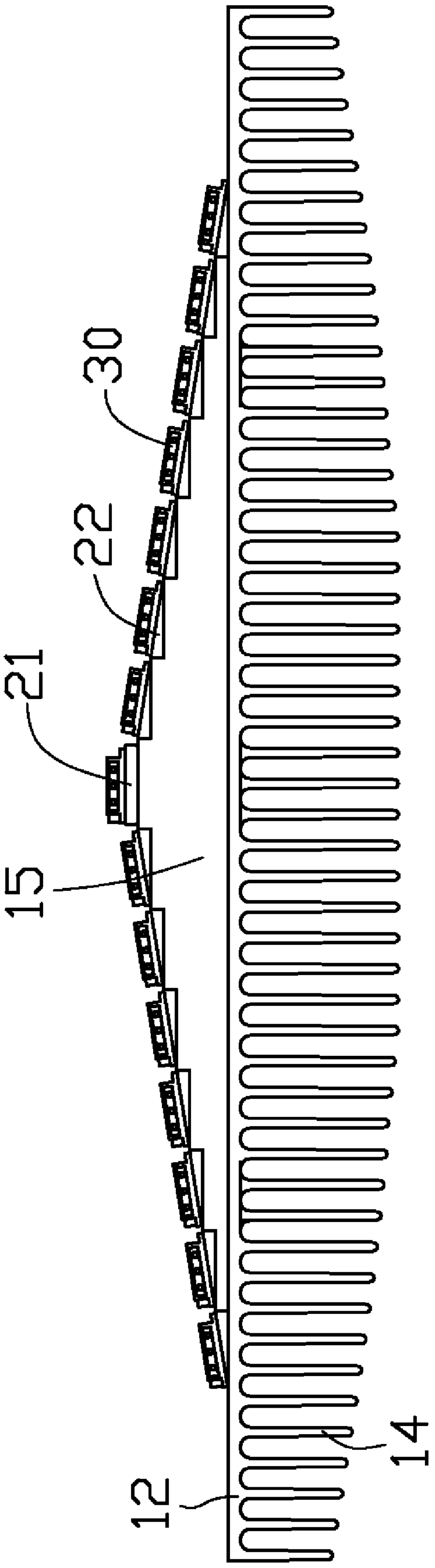
FIG. 4 is a front view of FIG. 1.
Figure 5:
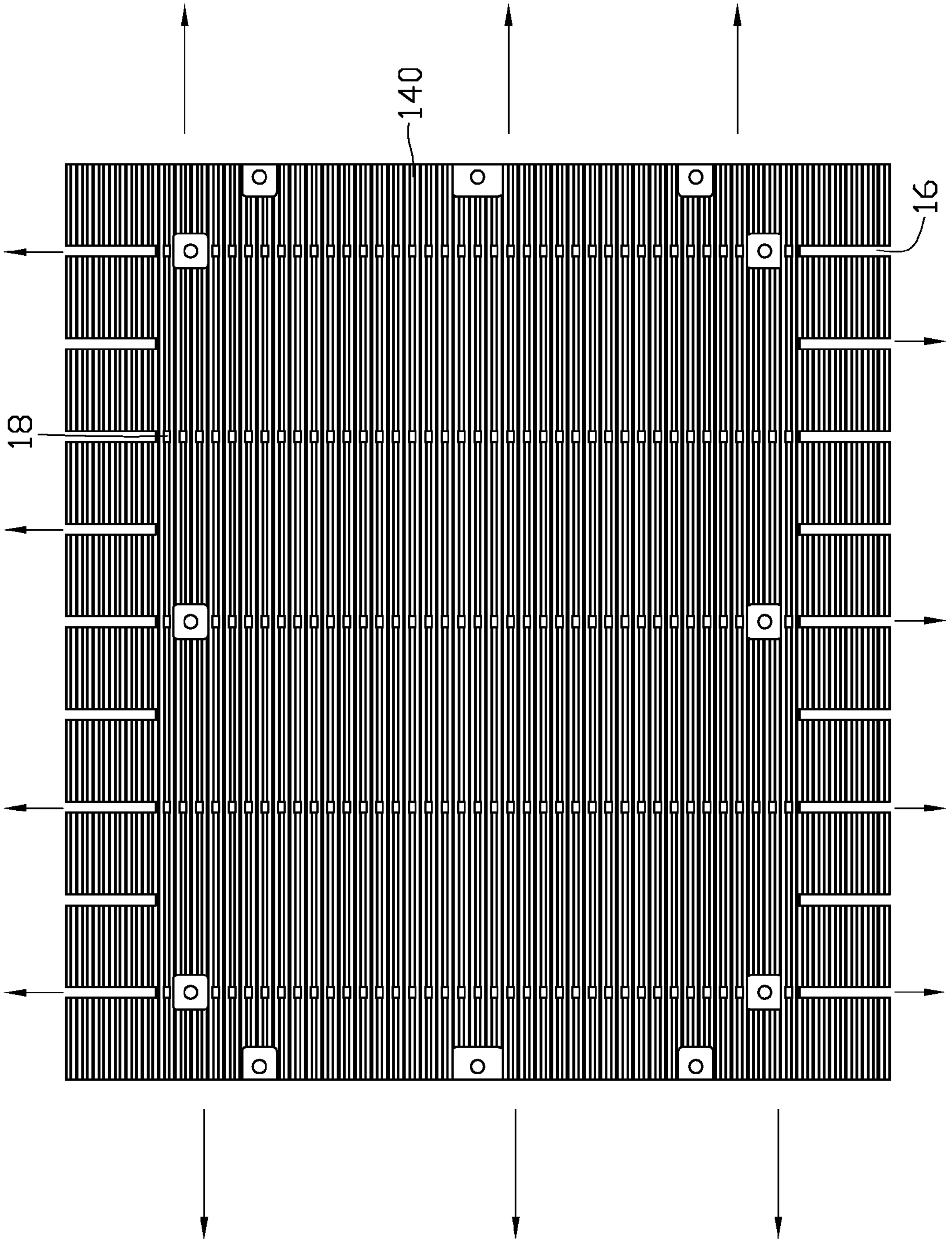
FIG. 5 is a bottom view of FIG. 1, showing airflow paths of the heat dissipation device.

In operation, referring to FIGS. 4-5, as the vapor chambers 20 have a high heat conducting efficiency, the vapor chambers 20 can almost immediately absorb the heat generated by the LED module 30 and quickly transfer the heat to the ridge 15 and the base 12. The base 12 of the heat sink 10 then directly transfers the heat to the fins 14 to be dissipated to ambient air. A cooling airflow can flow into the channels 140 defined between the fins 14. A part of the cooling airflow flows along the channels 140 and is heated when contacting with the fins 14; then, the heated cooling airflow flows away from the two short sides of the base 12 of the heat sink 10. By the provision of the grooves 18 and slits 16 being defined in the fins 14 of the heat sink 10 and perpendicular to the channels 140 to interrupt the continuity of the channels 140, another part of the cooling airflow can flow along the grooves 18 and slits 16 and then flow away from the two long sides of the base 12 of the heat sink 10. The cooling airflow is discharged from the fins 14 of the heat sink 10 not only along the channels 140 from the short sides of the base 12 of the heat sink 10 but also along the grooves 18 and slits 16 from the long sides of the base 12 of the heat sink 10. The cooling airflow flows away from the fins 14 of the heat sink 10 along the four sides of the base 12 of the heat sink 10 so that the cooling airflow has more airflow paths through the fins 14 of the heat sink 10, in comparison with a conventional heat sink having fins defining parallel channels therebetween only, without slits/grooves intercrossing the channels. Therefore, the cooling airflow can have a more sufficient contact with the fins 14, and the heat dissipation efficiency of the heat sink 10 is greatly enhanced.

As the printed circuit boards 31 on the two lateral sides of the ridge 15 are aslant to the top surface of the base 12, the light emitted by the LEDs 32 on the printed circuit boards 31 can project outwardly towards two lateral sides of the heat sink 10. Therefore, an irradiation area of the LED lamp in accordance with the present invention is enlarged.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An LED lamp, comprising:

a heat sink comprising:

a base having a first surface and a second surface opposite to the first surface thereof;

a plurality of fins extending from the first surface of the base with a plurality of channels defined between the fins; and a triangular ridge formed on the second surface of the base;

a plurality of vapor chambers mounted on the ridge of the base; and an LED module mounted on the vapor chambers;

wherein a plurality of steps is formed on two lateral sides of the ridge, and the steps on two lateral sides are symmetric respect to a top end of the ridge.

2. The LED lamp as claimed in claim 1, wherein a plurality of triangular prism-shaped vapor chambers are fitly attached on the steps to form a flattened inclined surface, and a rectangular bar-shaped vapor chamber is mounted on the top end of the ridge.

3. The LED lamp as claimed in claim 1, wherein the top end of the ridge is at a middle portion of the second surface of the base.

4. The LED lamp as claimed in claim 1, wherein the LED module comprises a plurality of printed circuit boards each having a plurality of LEDs arrayed thereon, and the printed circuit boards are mounted on each of the vapor chambers, respectively.

5. The LED lamp as claimed in claim 1, wherein a plurality of slits is defined through two opposite sides of the base and the fins of the heat sink, and the slits are perpendicular to the channels.

6. The LED lamp as claimed in claim 5, wherein the slits are located beside two lateral sides of the ridge.

7. The LED lamp as claimed in claim 5, wherein a plurality of grooves cuts through the fins, and at least one of the grooves communicates with one of the slits.

8. The LED lamp as claimed in claim 1, wherein heights of the fins are gradually decreased along a direction away from a middle portion of the base of the heat sink.

9. A heat dissipation device for dissipating heat from LED modules, comprising:

a heat sink comprising a base having a plurality of fins on one side and a triangular ridge at an opposite side thereof adapted for mounting the LED modules thereon; and a plurality of vapor chambers mounted on the ridge, adapted for contacting the LED modules directly and transferring heat generated by the LED modules to the heat sink;

wherein a plurality of slits are defined through two opposite side edges of the base and the fins at the two opposite side edges of the base.

10. The heat dissipation device as claimed in claim 9, wherein a plurality of steps is formed on two lateral sides of the ridge, and the steps are symmetric respect to a top end of the ridge.

11. The heat dissipation device as claimed in claim 10, wherein the vapor chambers comprise a plurality of triangular prism-shaped vapor chambers which are fitly attached on the steps.

12. The heat dissipation device as claimed in claim 9, wherein a top of the fins has an arced configuration.

13. The heat dissipation device as claimed in claim 9, wherein the slits are located beside two lateral sides of the ridge.

14. The heat dissipation device as claimed in claim 9, wherein a plurality of grooves cuts through the fins and at least one of the grooves communicates with one of the slits.

15. An LED lamp comprising:

a heat sink having a base with opposite first and second faces, a plurality of fins extending from the first face and a ridge formed on the second face;

a plurality of vapor chambers mounted on the ridge;

a plurality of printed circuit boards mounted on the vapor chambers; and a plurality of LEDs mounted on the printed circuit boards;

wherein the ridge has a top end and two slopes beside the top end and the LEDs over the slopes are oriented slantwise outwardly away from the top end.

16. The LED lamp as claimed in claim 15, wherein the LEDs over the top end are oriented perpendicular to the base.

17. The LED lamp as claimed in claim 15, wherein the vapor chambers on the slopes each have a configuration of a triangular prism.

18. The LED lamp as claimed in claim 15, wherein the fins define parallel channels therebetween and grooves intercrossing the channels.

* * * * *